United States Patent [19]
Kato et al.

[11] Patent Number: 4,698,494
[45] Date of Patent: Oct. 6, 1987

[54] IMAGE SENSOR AND METHOD OF MAKING

[75] Inventors: Toshiaki Kato, Kanagawa; Masakazu Ueno; Masaharu Nishiura, both of Yokosuka, all of Japan

[73] Assignee: Fuji Electric Co., Ltd., Kawasaki, Japan

[21] Appl. No.: 871,509

[22] Filed: Jun. 6, 1986

[30] Foreign Application Priority Data

Jun. 6, 1985 [JP] Japan .................................. 60-123180
Jun. 11, 1985 [JP] Japan .................................. 60-126579
Jun. 11, 1985 [JP] Japan .................................. 60-126580

[51] Int. Cl.$^4$ ............................................ H01V 40/14
[52] U.S. Cl. .................................. 250/211 R; 250/578
[58] Field of Search ................. 250/211 R, 211 J, 578; 357/30 D, 30 H, 30 K, 24 CR

[56] References Cited

U.S. PATENT DOCUMENTS

4,575,638 3/1986 Okumura ............................ 250/578
4,650,984 1/1987 Furushima et al. ............. 250/211 R

Primary Examiner—David C. Nelms
Attorney, Agent, or Firm—Brumbaugh, Graves, Donohue & Raymond

[57] ABSTRACT

The invention provides a contact image sensor in which a common electrode is provided so as to oppose a plurality of individual electrodes arranged on a substrate across a photoconductive semiconductor film, characterized in that each of the individual electrodes is in contact with the semiconductor film through a window provided at a predetermined position in an insulating film. The insulating film can be made of a photosensitive resin, in which case the windows are formed by light exposure and development. Preferably, the insulating film is baked at an elevated temperature to purge impurities therefrom. The invention also provides image sensors in which the common electrode layer is made of an electrically conductive resin. Such resin electrodes overcome short-circuiting problems due to pinhole defects in the semiconductor film and can be used in known image sensor structures or in concert with the novel image sensor structure of the invention wherein the individual electrodes contact the semiconductor film through a window in an insulating layer.

11 Claims, 26 Drawing Figures

IMAGE SENSOR AND METHOD OF MAKING

BACKGROUND OF THE INVENTION

The present invention relates to contact image sensors for use in document scanning devices and to a method of making contact image sensors.

Known image sensing devices consist of an array of picture elements comprising an array of individual electrodes separated from a common electrode by a photoconductive material. When light falls on the device, current flows between the individual electrode and the common electrode of each illuminated picture element. Detection of the current for each picture element provides an electrical signal pattern which is indicative of the image detected.

Figure 1A:
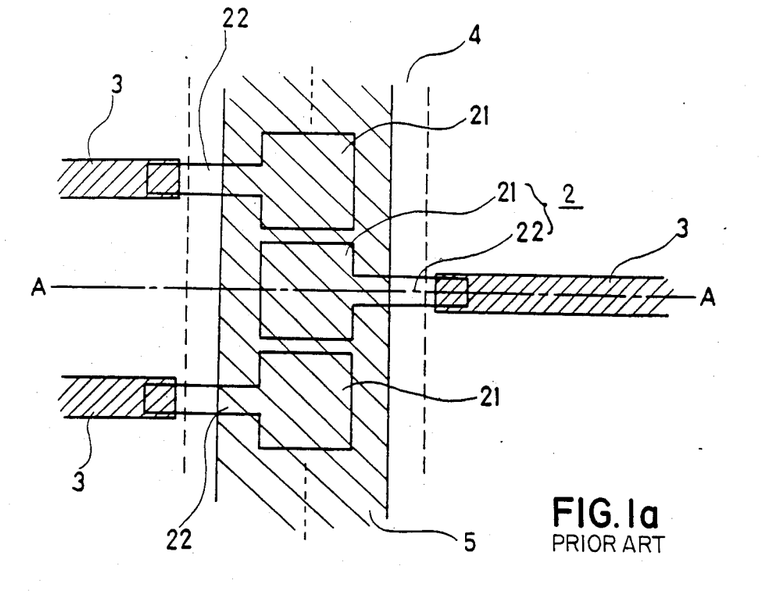
Figure 1B:
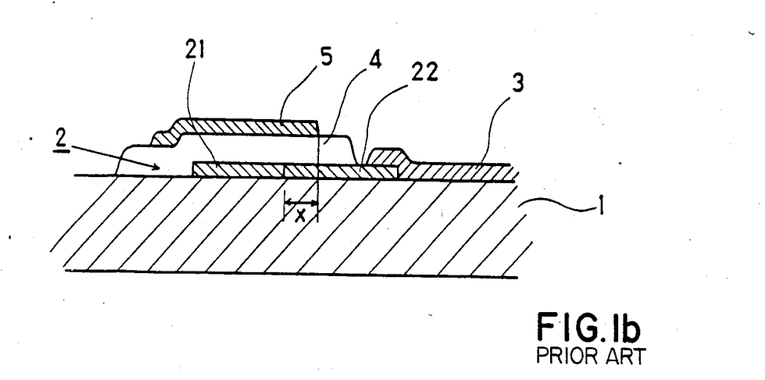

FIG. 1 shows one known type of image sensor structure employed as a contact image sensor for facsimile equipment or the like. FIG. 1(a) is a plan view of the image sensor, and FIG. 1(b) is a sectional view of the sensor taken along the line A—A in FIG. 1(a). Transparent individual electrodes 2 each having a contact portion 21 and a lead portion 22 are arranged in a row on a glass substrate 1. This type of image sensor is formed in such a manner that an electrically conductive transparent thin film such as indium-tin oxide (ITO) is formed on the whole surface of the substrate to a thickness of 500Å to 2,000Å by either electron beam evaporation or sputtering, and then shaped in a pattern by photolithography and etching. Then, a metal film is deposited, and metal conducting strips 3 which are in contact with respective lead portions of the transparent electrodes are formed therefrom by photolithography and etching. This metal film may be made of a single metal, such as Cr, Al, Mo, W, Ni, Cu or Au. Alternatively, the metal film may advantageously comprise three different metal layers, e.g., Cr (thickness: 500 to 3,000Å), Ni (thickness: 1,000Å to 1.0 μm) and Cu (thickness: 500 to 3,000Å) to better withstand subsequent processing steps and to improve adhesion of the metal film to the glass substrate.

An amorphous silicon (a-Si) photoconductive layer 4 is formed thereon by glow discharge of silane gas. This a-Si layer 4 is formed so as to cover the contact portions 21 of the transparent individual electrodes by employing a metal mask. Examples of the a-Si layer 4 include one in which an undoped a-Si layer of 0.5 μm thickness and an n-type a-Si layer of about 500Å thickness are laminated to employ an ITO/a-Si heterojunction. In another example, a p-type a-Si layer of about 100Å thickness, an undoped a-Si layer of 0.5 μm thickness and an n-type a-Si layer of about 500Å thickness are laminated to employ a pin junction. In place of the p-type a-Si layer, a p-type a-SiC:H may be employed.

A metallic common electrode 5 is formed on the a-Si layer 4 by either evaporation or sputtering. The common electrode 5 may be made of Al, W, Cr, Ni, etc. and formed in a pattern using a metal mask during the evaporation or sputtering. In the foregoing manner, a row of picture elements are formed, in which light signals are received through the glass substrate 1.

Figure 2:
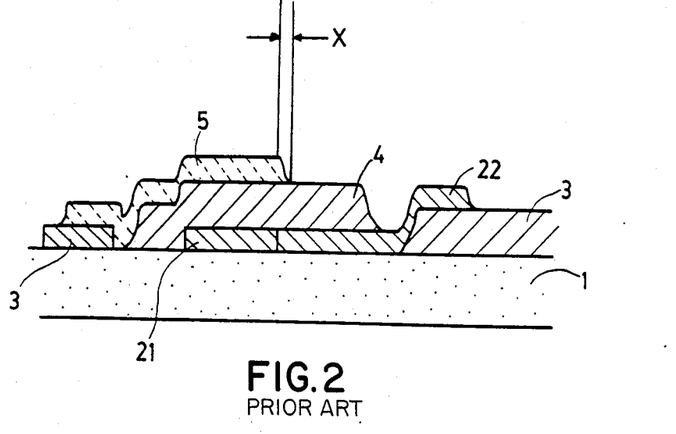
FIG. 2 is a cross-sectional view of second prior art image sensor.
Figure 3:
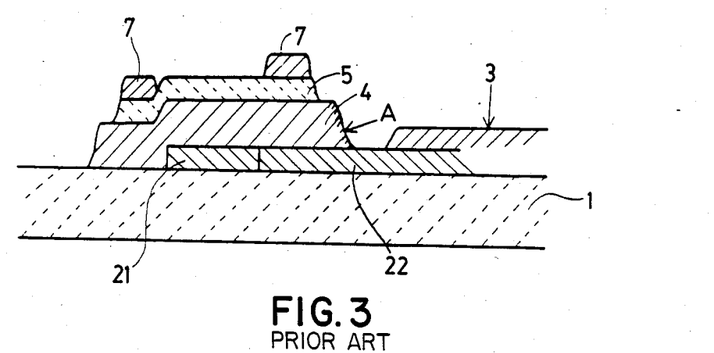
FIG. 3 is a cross-sectional view of third prior art image sensor.

FIGS. 2 and 3 illustrate other known image sensor structures. The illustrated contact image sensor in FIG. 2 is formed as follows. An electrically conductive paste is applied to an insulative substrate 1 by screen printing and subjected to photolithography and etching to form conducting strips 3. After evaporation of a chromium layer, photolithography and etching is carried out to form individual electrodes 2 having contact portions 21 and lead portions 22 in electrical contact with respective conducting strips 3. Then, a photoconductive film 4 is formed using a mask so as to cover the contact portions 21. For example, an intrinsic amorphous silicon hydride film (a-Si) can be formed by plasma CVD employing a mixture of silane gas and hydrogen gas. Then, a transparent common electrode 5 is formed by evaporation of indium-tin-oxide (ITO) using a mask so that the common electrode 5 overlies the contact portions 21 separated by the a-Si film 4.

FIG. 3 shows a third contact image sensor according to the prior art. This image sensor is formed as follows. Chromium and gold are deposited on a glass substrate 1 by evaporation, and photolithography and etching is carried out so that the contact portions 21 and lead portions 22 comprise a single layer of chromium, and the metal conducting strips 3 comprise two layers of chromium and gold. Then, p-type amorphous silicon hydride carbide (hereinafter referred to as "a-SiC"), intrinsic a-Si and n-type a-Si are successively deposited by plasma CVD to provide a photoconductive film 4. Then, ITO is deposited by evaporation to form the common electrode 5, and chromium film is further deposited by evaporation. Photolithography and etching are carried out to provide openings in the chromium layer which are directly above respective contact portions 21 of the individual electrodes 2. Thus, a transparent common electrode 5 having a light-shielding film 7 is formed.

Image sensors such as those shown in FIGS. 1 through 3 have several drawbacks. For example, the image sensors shown in FIGS. 1 and 2 involve variations in the overlap of the common electrode with the individual electrodes (denoted by x in the figure), since the common electrode 5 is formed by evaporation using a mask. At one extreme of the overlap x, the overlap between the common electrode 5 and the lead portions 22 is large, and the effective areas of the picture elements are increased. At the other extreme of the overlap x, the effective areas of the picture elements are reduced because the common electrode 5 does not completely overlap the contact portions 21. Thus, even though the areas of the individual electrodes 2 are constant, variations in the overlap x result in variations in the effective areas for photoelectric conversion of the picture elements. Consequently, variations in the photoelectric output of a picture element, which is proportional to its effective area, of ±30% have been observed. Such variations result in sensing devices of lower quality and reduces the production yield. In addition, since the ITO film deposited by evaporation is formed into a common electrode 5 of a desired configuration by photolithography and etching, the etching solution contacts the a-Si film 4. This lowers the quality of the a-Si film, resulting in a further reduction in the production yield.

The image sensor shown in FIG. 3 has a structure which overcomes the foregoing disadvantages. This structure, however, has an undesirable current leakage path between the metal conducting strip 3 and the common electrode 5 across the exposed sidewall A of the photoconductive film 4. Consequently, the leakage current of each picture element is large when there is no protective film covering the sidewall A. Such a leakage current leads to variations in the output of the sensor and a lowering in its reliability in terms of sensitivity to moisture and heat. To overcome this problem, an effective passivation technique in the form of an expensive protective film must be used, resulting in an increase in costs of the image sensor.

Another problem encountered in forming known image sensors arises during deposition of the common electrode onto the semiconductor film. This step involves depositing metal on the semiconductor film by, for example, vacuum evaporation or sputtering. If the semiconductor film has even minute pinhole defects, the metal electrode material may fill the pinhole, leading to a short circuit between the common electrode and an individual electrode. For example, in the case where the semiconductor film is an a-Si film and titanium or chromium is employed as the common electrode, a considerable number of short circuits are produced, resulting in a considerable reduction in the production yield. A granular aluminum film which cannot easily penetrate minute pinholes in the semiconductor film may be grown by evaporation. Therefore the use of aluminum as the common electrode provides a relatively high production yield. However, aluminum has poor resistance to corrosion and is easily diffused into a-Si. Consequently, the use of aluminum as the common electrode is not acceptable from the standpoint of reliability.

It is an object of the present invention to eliminate the above-described disadvantages of the prior art and provide a contact image sensor which has reduced variations in the photoelectric output among light-receiving elements, a reduced leakage current and reduced costs.

It is a further object of the present invention to overcome the above-described problems of the prior art and provide a highly reliable image sensor which is free from short circuits even when the photoconductive semiconductor film has pinhole defects.

It is a further object of the present invention to provide a manufacturing method for image sensors according to the invention, and particularly a method which provides baking at elevated temperatures or formation of an insulating film provided for the purpose of limiting the photoelectric conversion area of the picture element portion, thereby allowing an image sensor having stable characteristics.

SUMMARY OF THE INVENTION

The present invention provides a contact image sensor in which a common electrode is provided so as to oppose a plurality of individual electrodes arranged on a substrate across a photoconductive semiconductor film, characterized in that each of the individual electrodes is in contact with the semiconductor film through a window provided at a predetermined position in an insulating film. The insulating film can be made of a photosensitive resin, in which case the windows are formed by light exposure and development. Preferably, the insulating film is baked at an elevated temperature to purge impurities therefrom.

The present invention also provides image sensors in which the common electrode layer is made of an electrically conductive resin. Such resin electrodes overcome short-circuiting problems due to pinhole defects in the semiconductor film and can be used in known image sensor structures or in concert with the novel image sensor structure of the invention wherein the individual electrodes contact the semiconductor film through a window in an insulating layer.

BRIEF DESCRIPTION OF THE DRAWINGS

In each of the drawings, components performing a common function are indicated by the same reference numeral.

FIGS. 1a and 1b show an image sensor according to the prior art —FIG. 1(a) plan view; FIG. 1(b) cross-section.

FIG. 12 shows two views of an image sensor according to a fifth embodiment of the invention —12(a) cross-section; 12(b) plan.

DETAILED DESCRIPTION OF THE INVENTION

The present invention involves two improvements in the structure of image sensors which can be used either individually or in concert, and a method for fabricating those improved structures. Image sensors according to the invention provide improved performance characteristics, as well as enhanced production yields.

Figure 4:
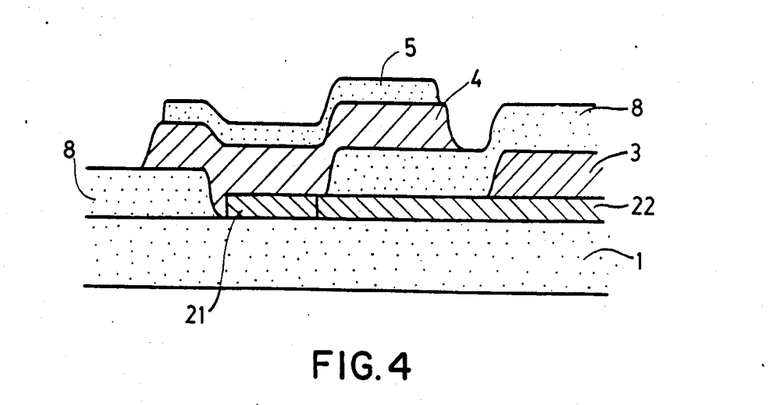
FIG. 4 is a cross-sectional view of an image sensor according to one embodiment of the invention.

As shown in FIG. 4, one embodiment of the invention reduces variability in photoelectric conversion area among individual electrodes by interposing a layer of an insulating film 8 between the individual electrodes 2 and the semiconductor photoconductive layer 4. Windows in the insulating film 8 are formed such that the semiconductor layer 4 makes contact with a predetermined area of the contact portion 21 of each individual electrode 2.

Advantageously, the insulating film layer can be made from a photosensitive resin. The pattern for the windows can then be formed by exposure of the resin layer to light in an appropriate pattern and by developing the exposed resin layer. The use of photosensitive resins provides for greater accuracy and precision in the formation of the windows than can be achieved using, for example, masked deposition techniques. Accordingly, the variation in effective photoelectric conversion area which occurs in known devices such as that shown in FIGS. 1 and 2 is substantially reduced.

Furthermore, interposing a layer of insulating material between the individual electrodes and their associated wiring, and the semiconductor layer eliminates the type of leakage current observed in known devices such as shown in FIG. 3.

Image sensors according to the invention comprise
(a) a substrate;
(b) a plurality of individual electrodes arranged on one surface of the substrate, each individual electrode comprising a contact portion and a lead portion;
(c) an insulating film layer disposed over the individual electrodes, and having windows aligned with the contact portions;
(d) a semiconductor photoelectric conversion layer disposed over the insulating film layer which contacts the contact portions of the individual electrodes through the windows; and
(e) a common electrode disposed over the photoelectric conversion layer and opposite the contact portions of the individual electrodes.

The substrate is made of an insulating material. For example, glass and ceramic make suitable substrates.

The individual electrodes comprising contact portions 21 and lead portions 22 are formed on one surface of the substrate 1 from conductive materials such as chromium, indium-tin oxide (ITO), and gold. A thin layer of the electrode material is deposited on the substrate, for example by sputtering or electron beam evaporation, and then photoetching is carried out to form the contact portions 21 and lead portions 22 of the individual electrodes 2. Further layers of conductive material may be laid down to provide conducting strips 3 for electrical connection of the image sensor.

Following formation of the individual electrodes and associated conducting strips 3, a layer of an insulating material 8 is formed over the individual electrodes. Preferably, this insulating material is a photosensitive resin, which is subsequently exposed to light in an appropriate pattern and developed to form windows coincident with a predetermined area of the contact portions 21 of the individual electrodes 2.

Next, a semiconductor layer 4 is formed over the insulating layer 8 so as to contact the contact portions 21 through the windows. This layer can be formed from any photoconductive material, including amorphous silicon.

Finally, a common electrode 5 is formed on the semiconductor layer 4 opposite the contact portions 21. The common electrode 5 can be formed from ITO or other conductive materials. It is especially advantageous to form the common electrode from conductive resins as these are less susceptible to the formation of short circuits if the semiconductor layer contains any defects.

Figure 5A:
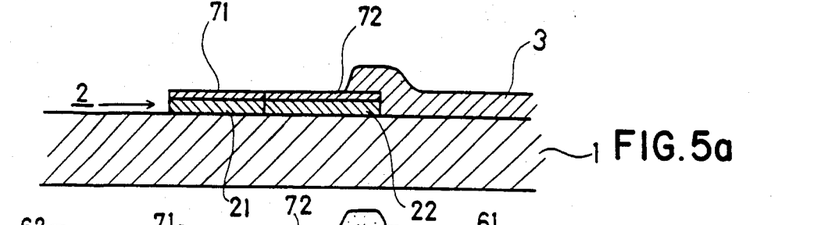
FIGS. 5a, 5b and 5c show a method of making image sensors according to a preferred embodiment of the invention.

In a preferred embodiment, the image sensor is formed as illustrated in FIG. 5. Looking first to FIG. 5(a), an electrically conductive transparent film made of ITO and having a thickness of about 1,000Å is formed on a substrate 1 by electron beam evaporation. Then, a Cr thin film with a thickness of 100Å to 1,000Å is formed by either electron beam evaporation or sputtering. These thin films, which constitute a two-layer structure, are subjected to patterning by photolithography and etching to form contact portions 21 and lead portions 22 of transparent individual electrodes 2 each having respective overlying Cr layers 71 and 72. The etching following this photolithography is carried out in such a manner that Cr is etched by a mixed solution of ammonium cerium nitrate and perchloric acid, and ITO is then etched by a mixed solution of ferric chloride and and hydrochloric acid. Conducting strips 3, which are in contact with the respective lead portions 22 and Cr film portions 72, are formed from a metal film.

Figure 5B:
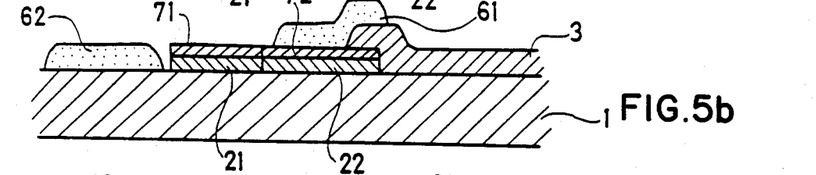

FIG. 5(b) shows the formation of the insulating film layer. Photosensitive polyimide patterns 61, 62 are formed. Thereafter, sintering was effected in a vacuum at 250° C., 300° C. and 350° C. for 1 hour. Following the sintering, the metal conducting strips 3 are covered with a resin (not shown), and the Cr film portions 71 on the contact portions 21 are removed by etching using a mixed solution of ammonium cerium nitrate and perchloric acid. (FIG. 5c) The resin employed in this step is 340C (trade name) manufactured by Yoshikawa Kako (K.K.), which is thinned with a thinner and applied by printing. The separation after the completion of etching was effected by employing trichloroethylene.

Figure 5C:
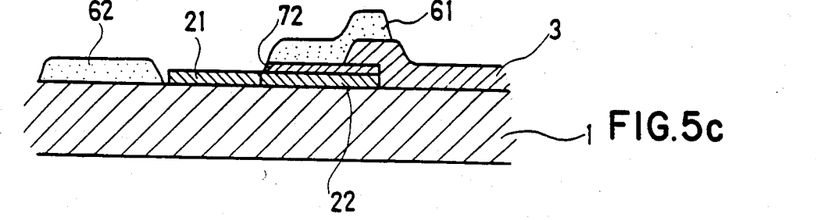

After these steps have been carried out, the a-Si layer 4 and the common electrode 5 were formed by conventional techniques.

Unlike unsintered image sensing devices which may show deterioration in the semiconductor layer and the formation of voids, the sample in which the polyimide pattern was sintered at 250° C. showed only a slight change of properties of the a-Si film. The samples which were sintered at 300° C. and 350° C. showed no change of properties and had no voids. The characteristics were also excellent, and characteristic variations were reduced to within ±10%. In addition, the output characteristics did not deteriorate even in a hightemperature application test (5 V, 80° C., 2,000 hours). As to the film thickness of the Cr films 71, 72, a thickness on the order of 100Å is sufficient. It has, however, been found that an increase in the Cr film thickness enables a light-shielding effect to be obtained and further reduces characteristic variations.

The invention will be further demonstrated by the following examples.

EXAMPLE 1

Figure 6:
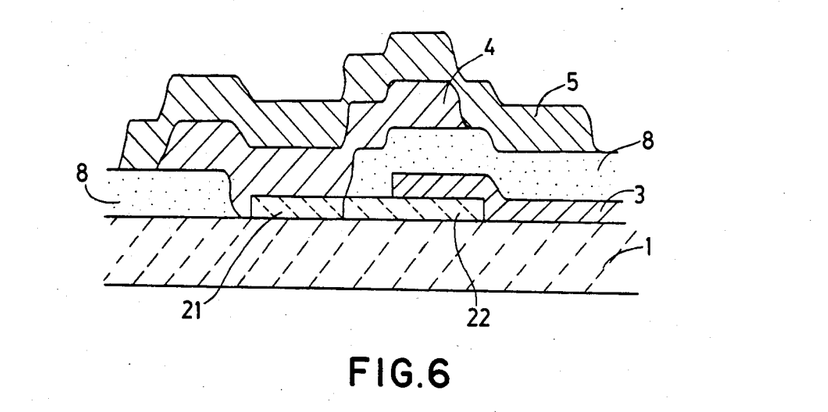
FIG. 6 is a cross-sectional view of an image sensor according to another embodiment of the invention.

FIG. 6 shows one embodiment of the present invention which was prepared as follows. ITO of 700Å thickness was formed on a glass substrate 1 by sputtering, and photolithography and etching was carried out to form a plurality of individual electrodes 2 each having a contact portion 21 and a lead portion 22. On the whole surface of this structure, chromium of 1,000Å thickness, nickel of 5,000Å thickness, and gold of 2,000Å thickness were successively deposited and patterned into conducting strips 3 by photolithography and etching. CBR-M901 (trade name) manufactured by Japan Synthetic Rubber Co., Ltd., which is a highly heat-resistant photosensitive resin, was applied over the metal conducting strips 3, thereby forming an insulating film 8 of 1 μm thickness. The insulating film 8 was exposed to light in an appropriate pattern and developed to provide windows exposing the contact portions 21 of the individual electrodes 2. Thereafter, past-baking was effected at 220° C. for two hours.

Figure 7:
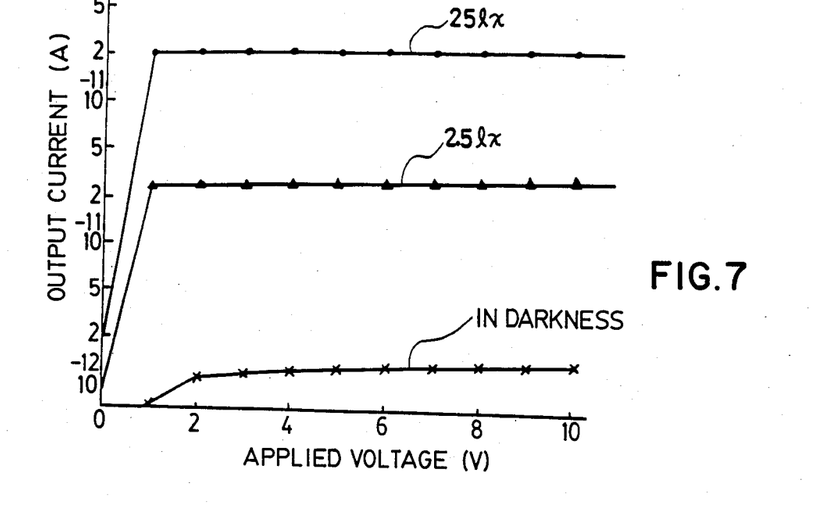
FIG. 7 shows the reverse bias output characteristics of a picture element according to the invention.

A common electrode 5 was then formed using conventional techniques. FIG. 7 shows the reverse bias currentvoltage characteristics of the image sensor element of FIG. 6. The area of each contact portion 21 was 100 μm×100 μm.

In a contact image sensor in which 1,728 picture elements in accordance with this embodiment are arranged in parallel, the average of the outputs of these elements at an illuminance of 25 lx when −5 V was applied across each picture element was $2.15 \times 10^{-10}$ AMPS. The output deviation $[\{(I_{max} - I_{min})/(I_{max} + I_{min})\} \times 100]$ of the picture elements was found to be 5.2%, where $I_{max}$ is the maximum current output and $I_{min}$ is the minimum current output.

EXAMPLE 2

Figure 8:
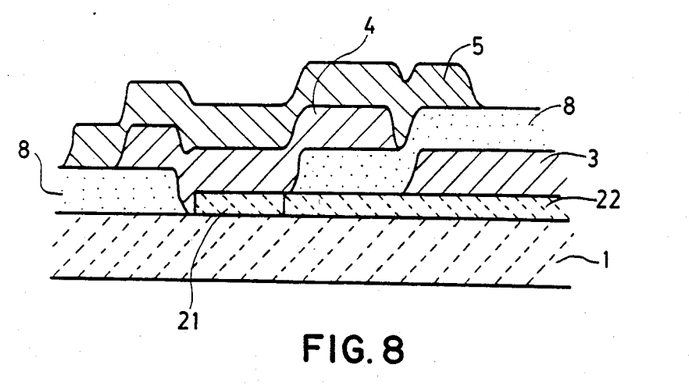
FIG. 8 is a cross-sectional view of an image sensor according to a third embodiment of the invention.

FIG. 8 shows another embodiment in which a glass substrate 1 was first coated with TCG-S coating agent, manufactured by Tokyo Oka Kogyo (K.K.), by dip coating. Thereafter, the TCG-S coating was heat-treated at 500° C. for 30 minutes to obtain an ITO coating of 500Å thickness which was then subjected to photolithography and etching to form the contact portions 21 and lead portions 22 of the individual electrodes. With the ITO contact portion 21 masked at, for example, the chip pitch, Ni of 5000Å thickness and Au of 500Å thickness were deposited by electroless plating to form conducting strips 3 and pad portions which were contiguous therewith. Then, a photosensitive polyimide, Photoniece VR-3100 (trade name), manufactured by Toray Industries, Inc., was coated to a thickness of 5 μm by a roll coater, and subjected to light exposure in a desired pattern to form windows coincident with the contact portions 21 of the individual electrodes. Then, spray development of the polyimide layer was effected, and baking was carried out at 350° C. for one hour to form an insulating film 8 having windows exposing the contact portions of the individual electrodes. At this time, the film thickness was reduced to 2 μm. Intrinsic a-Si photoelectric conversion film 4 of 1 μm thickness was then formed on the insulating film 8 by plasma CVD. Further, an electrically conductive carbon paste of 30 μm thickness was applied by screen printing to form a common electrode 6.

This embodiment provides picture elements having highly accurate predetermined areas as in Example 1 and needs no special passivation.

EXAMPLE 3

Figure 9:
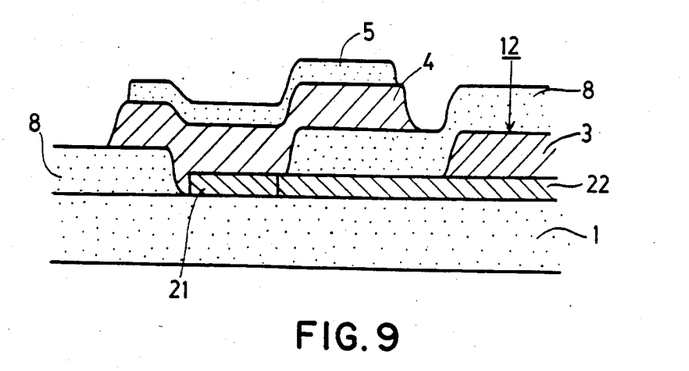
FIG. 9 is a cross-sectional view of an image sensor according to a fourth embodiment of the invention.

FIG. 9 shows still another embodiment of the present invention in which Cr of 1,000Å thickness and Au of 5,000Å thickness were deposited on a ceramic substrate 1 by evaporation, and contact portions 21, lead portions 22 and conducting strips 3 were formed by photolithography and etching. Further, a silicon nitride film of 1 μm thickness was formed by plasma CVD and subjected to photolithography and etching to provide an interlayer insulating film 8. Then, a p-type a-SiC layer of 200Å thickness, an intrinsic a-Si layer of 5000Å thickness and an n-type a-Si layer of 500Å thickness were deposited by carrying out plasma CVD again, thereby forming a photoconductive film 4. Thereafter, an ITO layer was formed by sputtering to form a common electrode 5 of 2,000Å thickness.

This embodiment is of the type which receives light from the upper side of the sensor, and, therefore, any protective film that is formed over the common electrode must be transparent. It is, however, unnecessary for such a transparent protective film to be of high quality.

EXAMPLE 4

The use of an electrically conductive resin to form one or more of the electrodes of a photoelectric conversion element involves the problem that when a photoelectric conversion element employing an electrically conductive resin is used in a high illuminance application, as in the case of a solar cell, the current density taken therefrom is so high that the higher contact resistance caused by the use of the conductive resin electrodes acts to prevent obtaining a high efficiency. However, since image sensors are used in relatively low illuminance applications, the contact resistance resulting from the use of conductive resin electrodes can be ignored.

Figure 10:
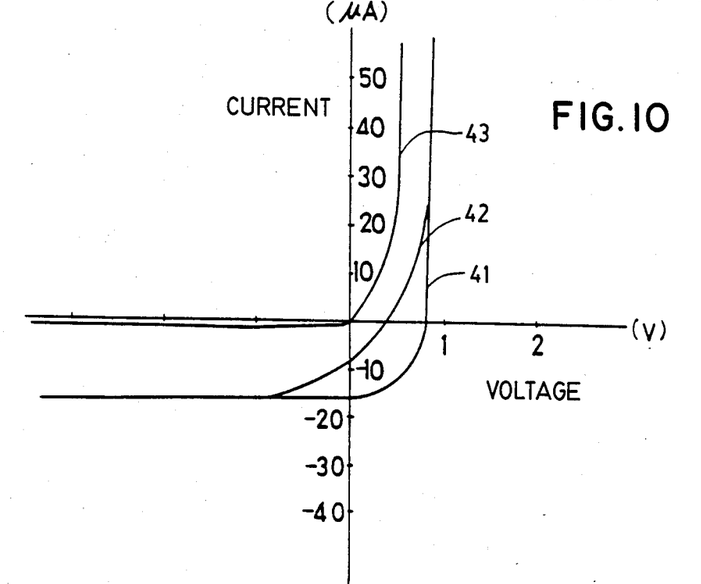
FIG. 10 compares the current-voltage characteristics of a photodiode having a resin common electrode according to the invention with those of a prior art photodiode.

An ITO film of 2,000Å thickness was formed on a glass substrate and subjected to photolithography and etching to form a pattern with an area of 1 $cm^2$. Then, the following films were successively formed: a p-type amorphous silicon carbide (a-SiC) film of 200Å thickness formed by generating plasma glow discharge under a pressure of 4 Torr in $SiH_4$ gas mixed with 1% of $B_2H_6$ and 5% of $C_2H_2$ and diluted with hydrogen; an intrinsic a-Si film of 5,000Å thickness formed by generating plasma glow discharge under a pressure of 6 Torr in a mixed gas of $SiH_4$ and hydrogen; and an n-type a-Si film of 500Å thickness formed by generating plasma glow discharge under a pressure of 4 Torr in $SiH_4$ mixed with 1% of $PH_3$ gas and diluted with hydrogen. An epoxy silver paste layer of 20 μm thickness was then formed using Dotite FA-705A (trade name), manufactured by Fujikura Kasei Co., Ltd., by screen printing so that the silver paste faces the ITO film across the a-Si layer. The silver paste layer was then sintered at 150° C. for 30 minutes. FIG. 10 shows the results of a comparison between the current-voltage characteristics of the image thus produced and those of a picture element having an arrangement similar to that of a conventional image sensor employing an Al evaporation film as the upper electrode. The comparison was made at an illuminance of 200 lx. The curve 41 shows the characteristics of the picture element having the conventional arrangement, while the curve 42 shows the characteristics of the picture element according to foregoing embodiment of the invention. Although the open-circuit voltage and short-circuit current of the picture element according to the invention are lower than those of the conventional picture element, the saturation current of the former at reverse bias is substantially equal to that of the latter. Thus, the picture element according to the foregoing embodiment of the invention has characteristics which enable it to be satisfactorily used as an image sensor. Curve 43 shows the characteristics of the picture element according to the invention in darkness.

EXAMPLE 5

Figure 11:
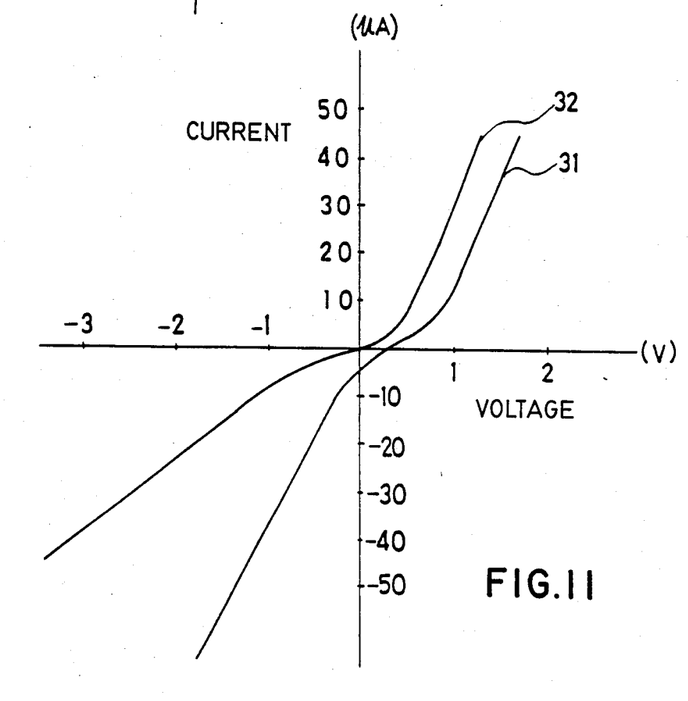
FIG. 11 shows the current-voltage characteristics of a photodiode with a resin common electrode according to the invention.

Individual electrodes made of ITO and having a thickness of 2,000Å and an area of 1 $cm^2$ were formed in a manner similar to that in Example 4. An intrinsic a-Si film of 1 μm thickness was formed on the first electrode by generating plasma glow discharge under 6 Torr in a gaseous mixture of $SiH_4$ and $H_2$. A common electrode was formed by screen printing, similar to that in Example 4, using three different kinds of paste, namely: the above-mentioned silver paste, Dotite FA-705A; a carbon paste, TU-20S (trade name), manufactured by (K.K.) Asahi Kagaku Kenkyusho; and a paste formed by kneading carbon and silver particles, TU-1-SL (trade name), manufactured by (K.K.) Asahi Kagaku Kenkyusho. FIG. 11 shows the current-voltage characteristics of the picture elements produced. Substantially the same characteristics were obtained for the three different kinds of electrically conductive paste. The curve 31 shows the characteristics at an illuminance of 200 lx, while the curve 32 shows the characteristics in darkness. The picture elements photodiodes of Example 5 also have characteristics which enable them to be satisfactorily used as an image sensor.

EXAMPLE 6

Figure 12A:
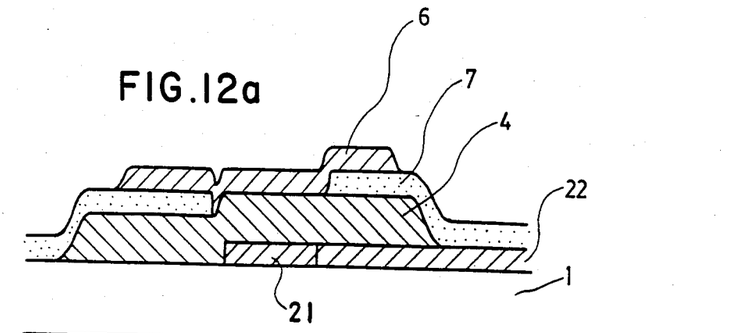
Figure 12B:
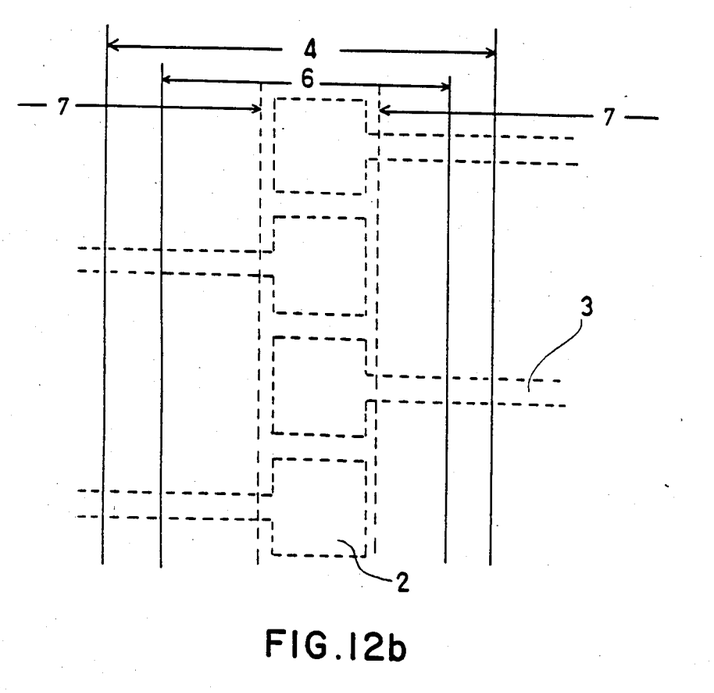

As shown in FIG. 12, 1,728 square ITO individual electrodes 2 of 100 μm × 100 μm and conducting strips 3 which are alternately led out in opposite directions were formed in parallel on a glass substrate 1. Then, the following films were successively formed: a p-type a-SiC film of 200Å thickness formed by plasma glow discharge in a gas prepared by mixing 5% of acetylene gas and 0.5% of diborane gas into silane gas and diluting this gas mixture 20 times with hydrogen; an intrinsic a-Si film of 5,000Å thickness formed by plasma glow discharge in a gas prepared by diluting silane gas 10 times with hydrogen; and an n-type a-Si film of 500Å thickness formed by plasma glow discharge in a gas prepared by mixing 0.1% of phosphine gas into silane gas and diluting this gas mixture 20 times with hydrogen. The PIN junction type photoelectric conversion film 4 was formed using a mask as shown in FIG. 12(b). Further, an interlayer insulating film 7 was formed using a cyclized polybutadiene resin, CBRM901 (trade name), manufactured by Nihon Kasei Gomu, in such a manner that windows were respectively opened to expose the individual electrodes 2. Finally, a common electrode 6 of 20 μm thickness was formed using the above-mentioned electrically conductive carbon paste, TU-20S, by screen printing.

The image sensor thus obtained showed current-voltage characteristics at applied voltages of −1 V to −5 V which are the same as those of an image sensor having a common electrode formed from an aluminum evaporation film. All the 1,728 elements functioned properly and no short circuit was found.

EXAMPLE 7

Figure 13:
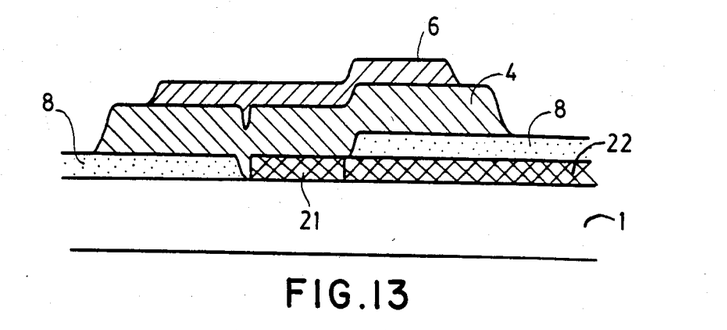
FIG. 13 is a cross-sectional view of an image sensor according to a sixth embodiment of the invention.

As shown in FIG. 13, a chromium film of 1,000Å thickness was formed on a glass substrate 1 by magnetron sputtering and then subjected to photolithography and etching to form 1,728 individual electrodes each having a contact portion 21 of 100 μm × 100 μm and a lead portions 22. The lead portions of the individual electrodes are formed in parallel in a manner similar to that of Example 5. Then, an interlayer insulating film 8 was formed using a photosensitive polyimide, Photoniece 3100 (trade name), manufactured by Torey Industries, Inc., and windows are opened in the insulating film 8 in the above-described manner to expose the contact portions 21 of the individual electrodes 2. Then, an intrinsic a-Si film of 1 μm thickness was formed by generating a plasma glow discharge in a gas prepared by diluting silane gas 10 times with hydrogen, and a p-type a-SiC film of 200Å thickness was formed on the a-Si film by generating a plasma glow discharge in a gas prepared by mixing 5% of acetylene gas and 0.5% of diborane gas into silane gas and diluting this gas mixture 20 times with hydrogen, thereby forming a photoelectric conversion film 4. Finally, an electrically conductive resin common electrode 6 was formed by screen printing using an electrically conductive transparent silicone paste mixed with fine powder of indium oxide.

The image sensor of this embodiment showed current-voltage characteristics at applied voltages of −1 to −5 V which were the same as those of an image sensor having a common electrode constituted by ITO, tin oxide or indium oxide formed by sputtering or evaporation. All the 1,728 elements functioned properly, and no short circuit was found.

EXAMPLE 8

Figure 14:
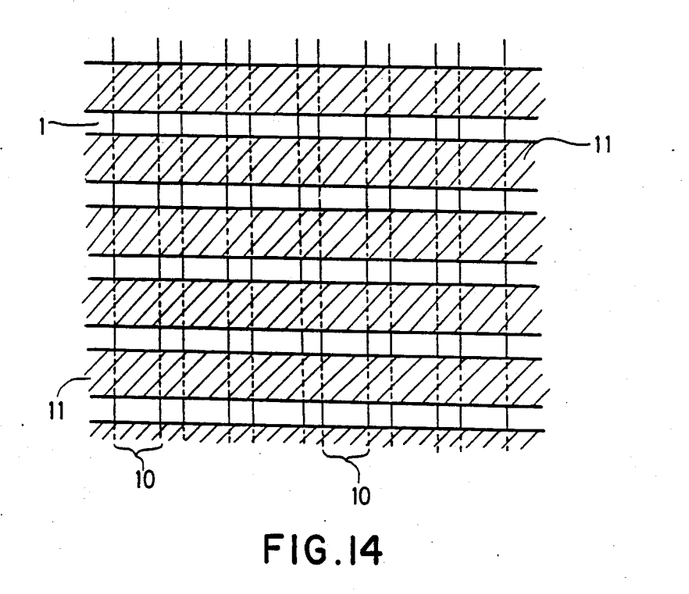
FIG. 14 is a plan view of an image sensor having a two-dimensional array of picture elements according to a seventh embodiment of the invention.

In this example, the resin electrodes are used in a two-dimensional image sensor. FIG. 14 is a plan view of this embodiment.

An ITO film of 700Å thickness was formed on a glass substrate 1 by evaporation and then subjected to photoetching to form 1,728 first electrodes 10 in parallel having a width of 100 μm and a length of 30 cm. An intrinsic a-Si film (not shown) of 1 μm thickness was formed thereon, and 240 second electrodes 11 having a width of 100 μm and a length of 21 cm were formed on the a-Si film by screen printing using an electrically conductive carbon paste in such a manner that the second electrodes extended perpendicularly with respect to the first electrodes.

The image sensor thus produced showed the same characteristics as those of a one-dimensional image sensor, and no occurrence of a short circuit was found. The image sensor in accordance with this embodiment may be widely applied to various kinds of devices and machines, such as facsimile and copying machines. In addition, this image sensor may be fabricated very low costs.

EXAMPLE 9

Figure 15:
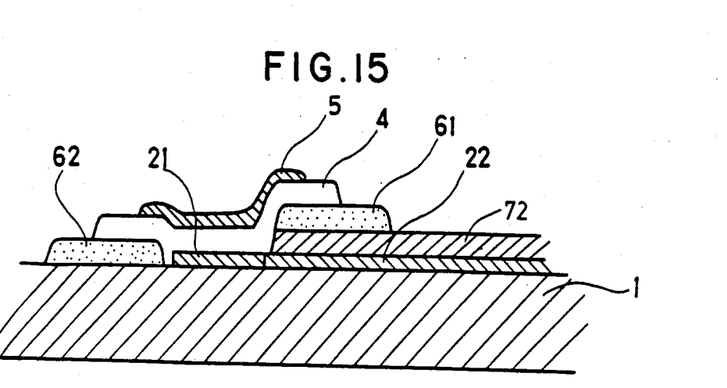
FIG. 15 is a cross-sectional view of an image sensor according to an eighth embodiment of the invention.
Figure 16A:
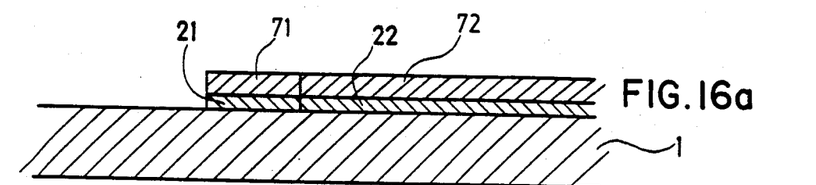
FIGS. 16a, 16b and 16c show a method of making the image sensor of FIG. 15.
Figure 16B:
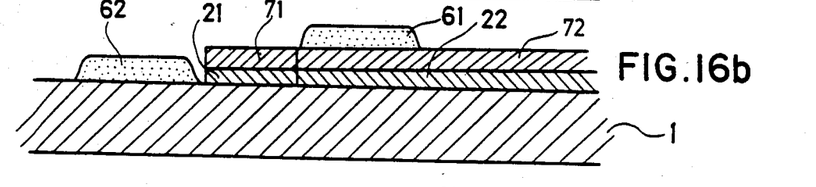
Figure 16C:
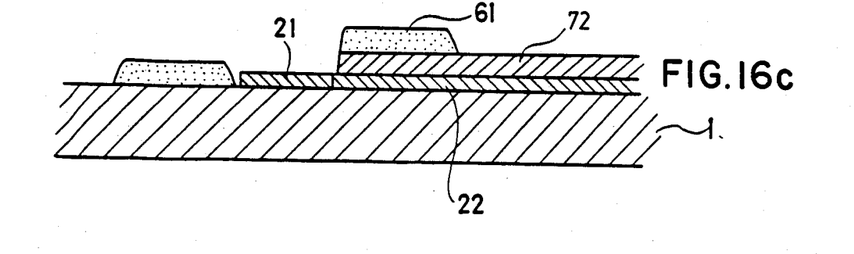

FIG. 15 shows an image sensor produced in accordance with another embodiment of the invention. FIG. 16 shows the steps in the process for manufacturing the image sensor. As shown in FIG. 16(a), an electrically conductive transparent film made of ITO and a metal film are successively formed on a glass substrate 1 and subjected to patterning using photolithography and etching to form transparent individual electrodes, each having a contact portion 21 and a lead portion 22 and metal films 71, 72 which respectively overlie the contact and lead portions 21, 22. Insulating film patterns 61, 62 are then formed (FIG. 16(b)) in the above-described manner. The lead portions 22 and the metal film 72 thereon are covered with a resin (not shown), and the metal film 71 is etched to expose the contact portions 21 of the transparent electrodes 2 (FIG. 16(c)).

An a-Si film 4 and a metal common electrode 5 are formed thereon using conventional techniques. With this arrangement, it was possible to reduce variations in the current-voltage characteristics among sensor elements to within ±10% and stabilize properties of the a-Si film against changes.

EXAMPLE 10

Figure 17:
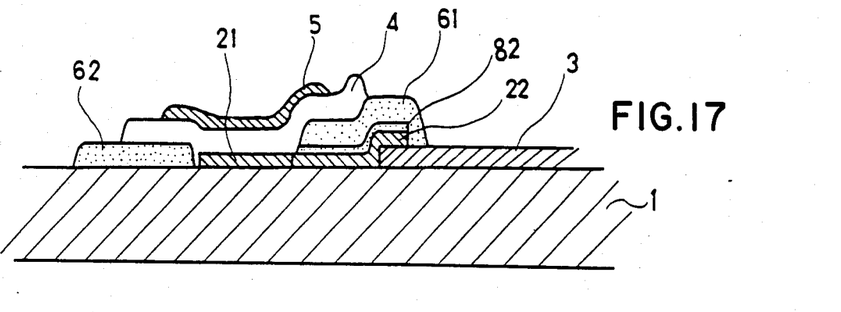
FIG. 17 is a cross-sectional view of an image sensor according to a ninth embodiment of the invention.
Figure 18A:
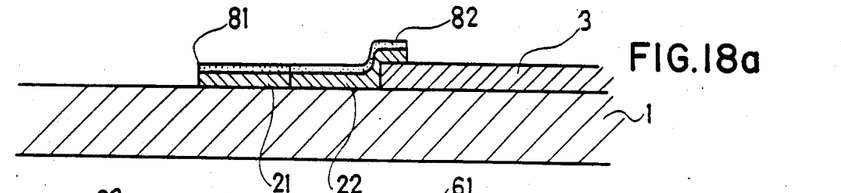
FIGS. 18a 18b and 18c show a method of making the image sensor of FIG. 17.
Figure 18B:
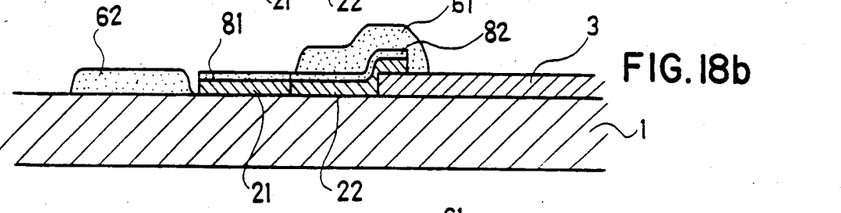
Figure 18C:
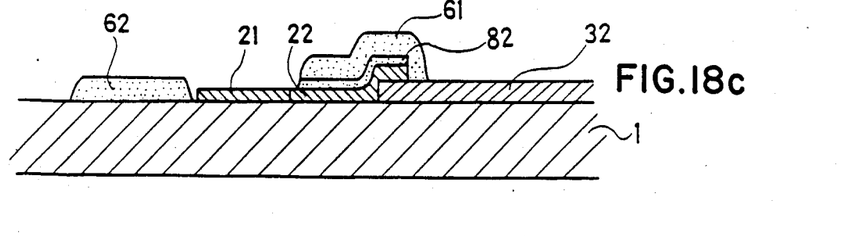

FIG. 17 shows an image sensor produced in accordance with still another embodiment. FIG. 18 shows the steps in the process for manufacturing the image sensor. As shown in FIG. 18(a), an electrically conductive transparent film made of ITO and an insulating film constituted by $SiO_2$ and $Si_3N_4$ is grown on a glass substrate 1. The SiO$_2$ film is formed by growing an insulating film made from a mixture of silane and oxygen. The SiO$_2$ film is formed by glow discharge using a mixed gas of silane and oxygen, and the Si$_3$N$_4$ film is formed by glow discharge decomposition of a gaseous mixture of silane and ammonia. The film forming temperature is 180° C. to 200° C. The insulating film is formed so as to have a total thickness of 100Å to several thousands Å. This twolayer film is subjected to patterning by photolithography and etching to form individual electrodes each having a contact portion 21 and a lead portion 22 and respective overlying insulating films 81, 82, which have the same pattern. The lead portions 22 of the transparent individual electrodes and conducting strips 3 are electrically connected. Insulating films 61, 62 are formed and subjected to patterning and sintering in a manner similar to that described in Example 9 (FIG. 18(b)). After the exposed portions of the conducting strips 3 have been covered with a resin (not shown), the insulating film 81 is removed by etching, and the resin is then separated.

Then, an a-Si layer 4 and a metal common electrode 5 are formed by conventional techniques to produce the sensor.

With this arrangement, it was possible to reduce variations in current-voltage characteristics among sensor elements to within ±10% and stabilize the properties of the a-Si film against changes.

As is clear from the description and examples hereinabove, image sensors according to the invention provide substantial advantages over previously known image sensors.

According to the foregoing embodiment of the present invention, contact portions of the individual electrodes of picture elements of an image sensor formed on an insulative substrate make contact with a photoelectric conversion semiconductor film and a common electrode through windows in an insulating film. Since the windows are formed in the insulating film by photolithography and etching, they can be formed with a high degree of accuracy. This eliminates the need for accuracy in positioning the common electrode on the semiconductor film and decreases the variability of electrical characteristics among picture elements.

Furthermore, the interposition of the insulating film prevents the occurrence of leakage current through the semiconductor film surface between the common electrode and the lead portions of the individual electrodes and the conducting strips connected to the lead portions. In consequence, it is not necessary to effect passivation on the surface and provide an expensive protecting film, and it is therefore possible to obtain a contact image sensor which has reduced variations in the photoelectric output among elements, a reduced dark current and reduced costs.

Further improvement can be achieved by baking the device immediately after development of the insulating layer to remove impurities which might cause defects in the completed device. During sintering, the surfaces of the individual electrodes are covered with a thin metal film or an inorganic insulating film formed at a relatively low temperature. Therefore, even when sintering is effected at a relatively high temperature, the electrodes are not deteriorated. It is believed that the reason why the electrically conductive transparent film is not deteriorated is that the coating blocks the release of a component of the electrically conductive film.

Although the above description has been made about a resinous insulating film which needs sintering at a relatively high temperature, it will be clear that similar advantageous effects can be obtained when this insulating film is replaced with an inorganic insulating film which is formed at a relatively high temperature. For example, it is necessary to form a nitride film and an oxide film by CVD at 300° to 350° C. When a sensor is produced after an electrically conductive film has been exposed to such high-temperature atmosphere, desired characteristics cannot be obtained. However, when an insulating film is formed in such a manner that the electrically conductive transparent film is covered with a film which is formed at a relatively low temperature, the electrically conductive film is not deteriorated, so that it is possible to obtain an image sensor having excellent characteristics.

The use of an electrically conductive resin as the common electrode which is provided on a photoelectric conversion film of an image sensor also provides advantages over the prior art. When the photoelectric conversion film has a pinhole, the electrically conductive resin cannot enter the pinhole by virtue of its high viscosity, so that there is no fear of the second electrode short-circuiting with the first electrode. In addition, since the second electrode, which is exposed at the upper surface, is made of a resin, no corrosion occurs as in the case of an Al electrode, and there is also no problem of diffusion into Si. Since it is possible to obtain an electrode with excellent adhesion by selecting as desired a composition of a resin as a binder into which electrically conductive particles are mixed, the reliability of the image sensor can be improved.

Further, since an electrically conductive resin can be pasted and formed in a pattern by a low-cost process such as screen printing, it is extremely effective in reducing the production cost of the image sensor.

We claim:

1. An image sensor comprising
   (a) a substrate,
   (b) a plurality of individual electrodes disposed on one surface of the substrate, each individual electrode comprising a contact portion and a lead portion,
   (c) an insulating film layer disposed over the individual electrodes,
   (d) a semiconductor photoelectric conversion layer disposed on the insulating film layer, and
   (e) a common electrode disposed on the semiconductor photoelectric conversion layer opposite the contact portion of the individual electrodes, wherein windows are formed in the insulating film layer such that contact is made between the contact portions of the individual electrodes and the semiconductor photoelectric conversion layer through the windows.

2. An image sensor according to claim 1, wherein the insulating film layer is formed from a photosensitive resin and wherein the windows are formed by light exposure and development of the photosensitive resin.

3. An image sensor according to claim 1, wherein the common electrode is formed from an electrically conductive resin.

4. An image sensor according to claim 2, wherein the common electrode is formed from an electrically conductive resin.

5. An image sensor comprising
   (a) a substrate, (b) a plurality of individual electrodes arranged on one surface of the substrate, each comprising a contact portion and a lead portion, (c) a semiconductor photoelectric conversion layer disposed over the individual electrodes, and (d) a common electrode disposed over the semiconductor photoelectric conversion layer and opposite the contact portions of the individual electrodes wherein the common electrode is formed from an electrically conductive resin 6. A method for making an image sensor comprising the steps of (a) forming a plurality of individual electrodes on a substrate, each individual electrode comprising a contact portion and a lead portion, (b) depositing an insulating film layer over the individual electrodes, (c) forming windows in the insulating film layers such that at least a portion of the contact portion of the individual electrodes are exposed, (d) depositing a semiconductor photoelectric conversion layer over the insulating film such that the semiconductor layer makes contact with the contact portions of the individual electrodes through the windows, and (e) forming a common electrode on the semiconductor photoelectric conversion film, said common electrode being disposed opposite the contact portions of the individual electrodes.

7. A method according to claim 6, wherein the insulating film layer is a photosensitive resin and wherein the windows are formed by exposing the insulating film layer to light and developing it.

8. A method according to claim 6, further comprising the step of baking prior to depositing the semiconductor photoelectric conversion layer to remove impurities from the insulating film layer.

9. A method according to claim 8, wherein the baking is done at a temperature of 300° C. or higher.

10. A method according to claim 6, further comprising the steps of depositing a protective coating on the individual electrodes prior to forming the insulating film;

baking prior to depositing the semiconductor photoelectric conversion layer to remove impurities from the insulating film layer; and removing the protective coating from the contact portions of the individual electrodes to expose the contact portions through the windows.

11. A method according to claim 10, wherein the baking is done at a temperature of 300° C. or higher.

* * * * *